United States Patent [19]
Kurihara

[11] Patent Number: 5,127,020
[45] Date of Patent: Jun. 30, 1992

[54] BIAS CONTROL DEVICE

[75] Inventor: Takao Kurihara, Tokyo, Japan

[73] Assignee: Clarion Co., Ltd., Tokyo, Japan

[21] Appl. No.: 619,305

[22] Filed: Nov. 28, 1990

[30] Foreign Application Priority Data

Dec. 1, 1989 [JP] Japan ................................ 1-313814

[51] Int. Cl.⁵ ............................................... H04K 1/00
[52] U.S. Cl. .......................................... 375/1; 380/34; 333/150; 333/195
[58] Field of Search ...................... 375/1, 102; 380/33, 380/34, 39, 40; 455/33, 59, 61, 103, 191, 212, 213, 224, 225; 310/313 B, 313 A, 313 R; 333/194, 195, 196, 150, 151, 152, 153, 154; 379/59, 63

[56] References Cited

U.S. PATENT DOCUMENTS

| 4,675,839 | 6/1987 | Kerr | 333/150 X |
| 4,697,115 | 9/1987 | Mitsutsuka | 333/150 X |
| 4,764,701 | 8/1988 | Garbacz et al. | 310/313 R |
| 4,943,975 | 7/1990 | Kurihara et al. | 375/1 |
| 5,028,101 | 7/1991 | Sugai et al. | 333/195 X |

Primary Examiner—Tod R. Swann
Attorney, Agent, or Firm—Flynn, Thiel, Boutell & Tanis

[57] ABSTRACT

A bias control device for a narrow band interference suppressing filter using a surface acoustic wave (SAW) element is disclosed, in which bias shift signals corresponding to spectre intensities of channels having central frequencies different from each other outputted from the filter are caught as digital data; magnitudes of the data are compared and at the same time the channel numbers are sorted in the order of the spectre intensities; and control signals for the filter are generated in this way.

9 Claims, 15 Drawing Sheets

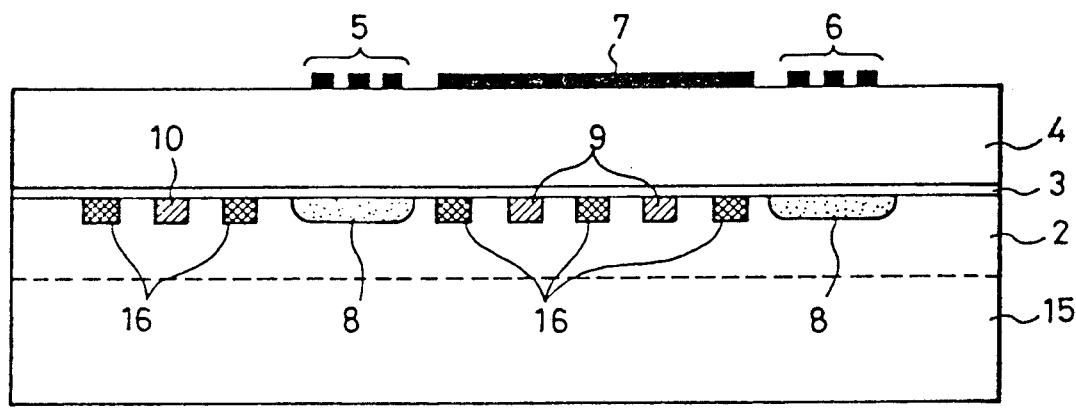
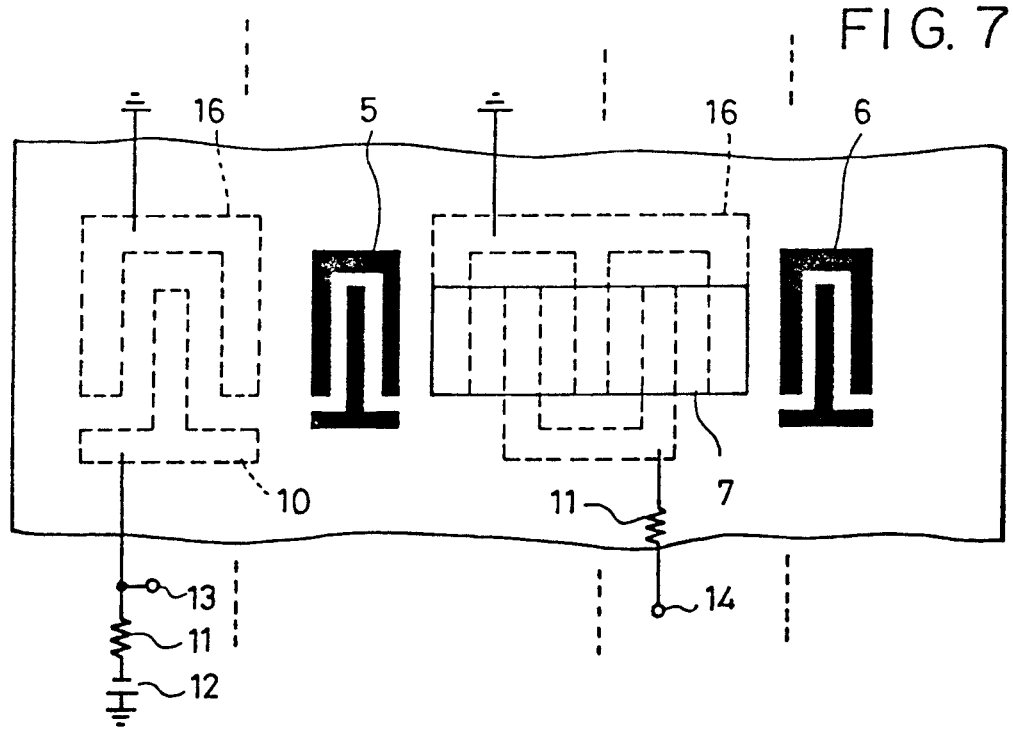

BIAS CONTROL DEVICE

FIELD OF THE INVENTION

The present invention relates to a bias control device suitable for a narrow band interference suppressing filter.

BACKGROUND OF THE INVENTION

One of the problems in the spread spectrum (hereinbelow abbreviated to SS) communication system using a wide frequency band is that impossibility of communication or error rate is increased by narrow band interference of high level. In order to solve this problem, a filter using surface acoustic wave (hereinbelow abbreviated to SAW) has been invented.

As means for solving the problem described above a Japanese patent, application No. 1-267503 (corresponds to U.S. Ser. No. 07/521 142), has filed by the inventors of the present invention, etc.

FIGS. 6A and 6B indicate the construction of an SAW element corresponding to 1 channel having a certain central frequency in a device for removing narrow band interference signals according to the invention described in the previous application stated above.

In the figures, reference numeral 1 is a $p^-$ ($n^-$) type Si monocrystal substrate; 2 is a p(n) type Si epitaxial layer formed on the substrate; 3 is a thermal oxide layer formed further thereon; 4 is a ZnO piezoelectric thin layer formed on the thermal oxide layer. Said Si substrate, Si epitaxial layer 2, the thermal oxide layer 3, the piezoelectric layer 4 constitutes a piezoelectric substrate 5, 6 and 7 are metal electrodes formed on the layer 4, which are an input SAW interdigital transducer, an output SAW interdigital transducer and a gate electrode, respectively; 8 is a high impurity concentration diffusion region formed in the p(n) type Si epitaxial layer 2 under each of the metal electrodes serving as the transducer, which plays the role of increasing the excitation efficiency of the transducers; and 9 is an $n^-$($p^-$) type impurity diffusion region formed in the p(n) type Si epitaxial layer 2 under the gate electrode 7, in which a first pn diode array is formed along the SAW propagation path. As indicated in the older patent application stated above, the operation of this pn diode array plays the role of controlling the carrier density in the epitaxial layer by controlling the diode bias and varying the attenuation constant of the SAW above 100 dB/cm by the interaction between the SAW and carriers. That is, it has a function of performing turning on and off of channels with a high speed. 10 is an n(p) type impurity diffusion region formed in the p(n) type Si epitaxial layer 2 outside of the input transducer, in which a second pn diode array 10' is formed; 11 is a resistor connected with each of the pn diode arrays; 12 is a DC power supply; 13 is a monitor terminal for voltage signals obtained by transforming input signals into SAW and detecting them by means of the second pn diode array 10', which is a terminal through which the intensity (electric power) of the input signal within the relevant channel (frequency domain) is observed as variations in voltage; and 14 is a bias control terminal for the first pn diode array.

FIGS. 7A and 7B show another embodiment of the older invention stated above. The operation thereof is similar to that explained, referring to FIGS. 6A and 6B and the difference is that a high resistance Si monocrystal substrate 15 is used as the substrate and the $p^-$($n^-$) type impurity diffusion region 16 is formed between the $n-$($p+$) impurity diffusion regions in the p(n) type Si epitaxial layer 2. That is, the difference is that the ohmic contact for the $p+$($n+$) type region is formed on the back side surface in FIGS. 6A and 6B, while it is formed on the front side surface in FIGS. 7A and 7B. The construction indicated in FIGS. 7A and 7B has an advantage that the pitch of the pn diode arrays can be designed independently from the thickness of the epitaxial layer and has a performance higher than that indicated in FIGS. 6A and 6B as the filter construction.

Now the function of detecting the SAW signal by means of the second pn diode array described above will be explained. The second pn diode array 10 disposed outside of the input transducer 5 is biased by the DC power supply through the resistor 11. The bias point giving the optimum sensitivity for the SAW is at a point, where the diode array is a little forward biased The SAW, into which the input signal is transformed by the input transducer, propagates on the second pn diode array to modulate the potential of the diodes in space and in time. A DC component depending on the signal intensity of the SAW is produced by the non-linear resistance of the second pn diodes and the potential at the monitor terminal 13 is shifted from the initial bias voltage to an inverse bias. The amount of the shift corresponds to the intensity of the input signal.

FIG. 8 indicates the relation between the electric power of the input signal and the amount of the bias shift. The amount of the bias shift is proportional to the square of the electric power of the SAW (electric power of the input signal). In this way the potential of the SAW is square-detected by the pn diode array disposed outside of the input transducer and thus the intensity of the input signal is obtained as the base band signal.

Consequently it is possible to obtain easily information on the distribution of the frequency spectre intensity of the input signal by constructing the device by connecting a plurality of channels consisting of the SAW element described above having different central frequencies in parallel.

FIG. 9 shows an example of the construction of a narrow band interference suppressing filter composed of n channels connected in parallel consisting of SAW elements having the construction described above. Hereinbelow this narrow band interference suppressing filter is called AISF (Adaptic Interference Suppression Filter).

The part composed of a group of input transducers 17 and a group of second pn diode arrays 20 in FIG. 9 is the part, which monitors the intensity distribution of the input spectrum. The groups of input and output transducers 17 and 18 perform the function of a sorting filter, by which input signals are classified, depending on the frequency, propagated and again synthesized. The group of the first pn diode arrays 19 on the SAW propagation path disposed for every channel controls the attenuation constant of the SAW of each channel.

The operation of the AISF system indicated in FIG. 9 is as follows. The input signal is transformed into the SAW by the group of input transducers 17 and the amount of the bias shift for the group of second pn diode arrays 20 is monitored. A bias control circuit 21 controls the bias voltage for the first pn diodes for the propagation control, depending on the amount of the bias shift thus obtained.

The function of this bias control circuit 21 is to amplify the amount of the bias shift of the second pn diodes 20 depending on the signal intensity for different channels and to bias backward pn diodes 19 in channels, in which the amount of the shift is great. Or not only it amplifies the amount of the bias shift, but also it has a function of setting a certain threshold and turning on (forward bias) and off (backward bias) of the bias for the first pn diode 19 by means of a comparator.

As it can be seen from FIGS. 6A, 6B, 7A, 7B and 9, the AISF system indicated in FIG. 9 has an advantage that it can be integrated on a same Si substrate in a monolithic manner. By using it, it is possible to intend to improve the performance and to decrease the size of the system.

FIGS. 10(a), 10(b) and 10(c) are schemes for explaining the flow of the signal processing by the AISF system, in which FIG. 10(a) indicates the spectre of an input signal, in which narrow band interference waves B and C are added to a wide band SS-SD signal A.

The channel numbers k and m corresponding to the frequencies of the interference waves B and C are detected and adapted to this environment, the filter characteristics of the AISF is changed to that indicated in FIG. 10(b), in which notches are formed in the channel portions k and m. The spectrum of the output signal of the AISF having the characteristics is that indicated in FIG. 10(c), in which the interference waves B and C are suppressed.

FIG. 11 shows an example of the system construction, in which the AISF system indicated in FIG. 9 is incorporated in the input stage of the receiving section in a DS-SS system. The AISF system 30 is disposed in the stage preceding a correlator and an AGC (automatic gain control) circuit 31' is disposed in the stage further preceding it. In this example of the system construction the output of the AISF system 30 is fed back to effect the gain control of the amplifier by means of the AGC 31'. BPF 32' is a band pass filter. If the AGC circuit were disposed without AISF system, when there are narrow band interference waves of high electric power, since the gain control is effected by the interference signals themselves, this would give rise to a problem that communication is impossible, or error rates increases, etc. in the DS-SS communication system. On the contrary, if the AISF system 30 is disposed, the gain control can be effected, depending on the signal intensity of a signal, for which the interference waves are suppressed, i.e. the spread spectrum signal itself and therefor the function of the DS-SS system is increased remarkably.

Further, FIGS. 12A, 12B and 13A, 13B show modified examples of the embodiments indicated in FIGS. 6A, 6B and 7A, 7B, in which a gate electrode 7' is disposed on the ZnO piezoelectric thin layer, corresponding to the second diode array 10.

Now the invention disclosed in the older application has still several points to be improved, as described below.

That is, in FIG. 9, since the detection sensitivity of the group of second pn diode array 20 monitoring the intensity distribution of the input spectrum is low, no good S/N can be obtained at the output thereof. For this reason the bias control circuit 21 was operated erroneously because of influences of noise. Therefore, in order to be able to reduce the influences of noise, the inventors of the present invention has proposed in Japanese patent application No. 1-337839 (which corresponds to U.S. Ser. No. 07/521 142) an ASIF, in which a third group of diode arrays having a shape approximately identical to that of the second pn diode arrays is disposed outside of the propagation path of the SAW.

According to this proposition, since the third group of pn diode arrays serves as a reference signal source, the influences of noise can be reduced by forming the difference between the voltage thereof and the potential of the second group of pn diode arrays.

FIG. 14 shows an embodiment of the device for removing narrow band interference signals according to the older patent application described previously, in which the same reference numerals as those indicated in FIG. 9 represent identical or analogous means.

In the device indicated in FIG. 14 the construction different from that disclosed in the older patent application indicated in FIG. 9 consists in that a third pn diode array 20' is disposed. This diode array 20' has a shape approximately identical to the second pn diode array 20 and is disposed on a same SAW element chip outside of the SAW propagation path. The detection terminal for the third pn diode array 20' is taken out independently from that for the second pn diode array to be connected with the bias control circuit 21 and connected also with the DC power supply through the resistor 11.

In the bias control circuit 21, there is disposed e.g. a comparing circuit 22 as indicated in FIG. 16. The detection signals coming from the terminals for detecting of the second group of pn diode arrays 20 are applied to the + terminals thereof and the detection signal coming from the terminal for detection of the third pn diode array 20' is applied to the terminal.

Since the third pn diode array 20' is disposed outside of the propagation path of the SAW, it can act as the reference signal source.

Consequently the potential difference between the second and the third pn diode array is formed in the bias control circuit 21 by the comparing circuit 22 and the processing is effected by using this difference signal as an effective detection signal. In this way, if this difference signal is used as the detection signal, the influences of noise can be reduced.

FIGS. 15A, 15B and 15C are schemes indicating an example of the SAW element described above, in which FIG. 15B is a top view of the element: FIG. 15A is a cross sectional view along the line A—A'; and FIG. 15B is a cross sectional view along the line B—B'. In FIGS. 15A, 15B and 15C, reference numeral 10' represents an n(p) impurity diffusion region formed in the p(n) type Si epitaxial layer 2, which constitutes the third diode array and 7" indicates a gate electrode.

The device can be operated, even if there is no gate electrode 7' indicated in FIG. 15.

However no concrete construction of the bias control circuit suitable for the AISF as described above and indicated in FIGS. 9 and 14 has been proposed and development thereof has been strongly desired.

OBJECT OF THE INVENTION

Consequently the object of the present invention is to provide a bias control device suitable for the AISF, in which bias shift signals outputted by the AISF described above are dealt with in a digital manner.

SUMMARY OF THE INVENTION

In order to achieve the above object, a bias control circuit according to a first invention of the application suitable for the AISF indicated in FIG. 9 is characterized in that it comprises a narrow band interference suppressing filter consisting of an input transducer and an output transducer for forming a plurality of channels in a surface acoustic wave propagation path disposed on a piezoelectric substrate, which cannels have central frequencies different from each other; a first group of diode arrays formed in the domain comprised between the input and the output transducer; and a second group of diode arrays formed in the surface acoustic wave propagation path on the side opposite to the first group of diode arrays with respect to the input transducer; a latch section, in which output signals coming from the second group of diode arrays are inputted and which holds channel data signals, each of which represents a bias shift corresponding to the spectre intensity of each of the channels, and at the same time generates channel ID signals representing channel numbers corresponding to the channel data signals to hold them; a sorting section, which compares the magnitudes of the channel data signals held in the latch section with each other and rearranges the channel ID signals outputted by the latch section on the basis of the result of the comparison; and a control signal generating section, which outputs channel control signals to the first group of diode arrays on the basis of the channel identifications rearranged by the storing section.

A bias control device according to a second invention of the present application suitable for the AISF indicated in FIG. 14 is characterized in that it comprises a narrow band interference suppressing filter consisting of an input transducer and an output transducer for forming a plurality of channels in a surface acoustic wave propagation path disposed on a piezoelectric substrate, which channels have central frequencies different from each other; a first group of diode arrays formed in the domain comprised between the input and the output transducer; a second group of diode arrays formed in the surface acoustic wave propagation path on the side opposite to the first group of diode arrays with respect to the input transducer; and an diode array for reference juxtaposed to the second group of diode arrays; a latch section, in which output signals coming from the second group of diode arrays and the diode array for reference are inputted and which holds channel data signals, each of which represents a bias shift corresponding to the spectre intensity of each of the channels, and a reference signal corresponding to internal noise of the filter; calculating means for obtaining differences of the channel data signals held in said latch section from the reference signal; a channel ID signal latch section, which generates channel ID signals representing channel numbers corresponding to the channel data signals to hold them; a sorting section, which rearranges the channel ID signals outputted by the latch section; and a control signal generating section, which outputs channel control signals to the first group of diode arrays on the basis of the channel identifications rearranged by the sorting section.

BRIEF DESCRIPTION OF THE DRAWINGS

FIGS. 6A, 6B and 7A, 7B are schemes indicating examples of the SAW element used in the AISF device according to the invention disclosed in an older application;

DETAILED DESCRIPTION

Figure 1:
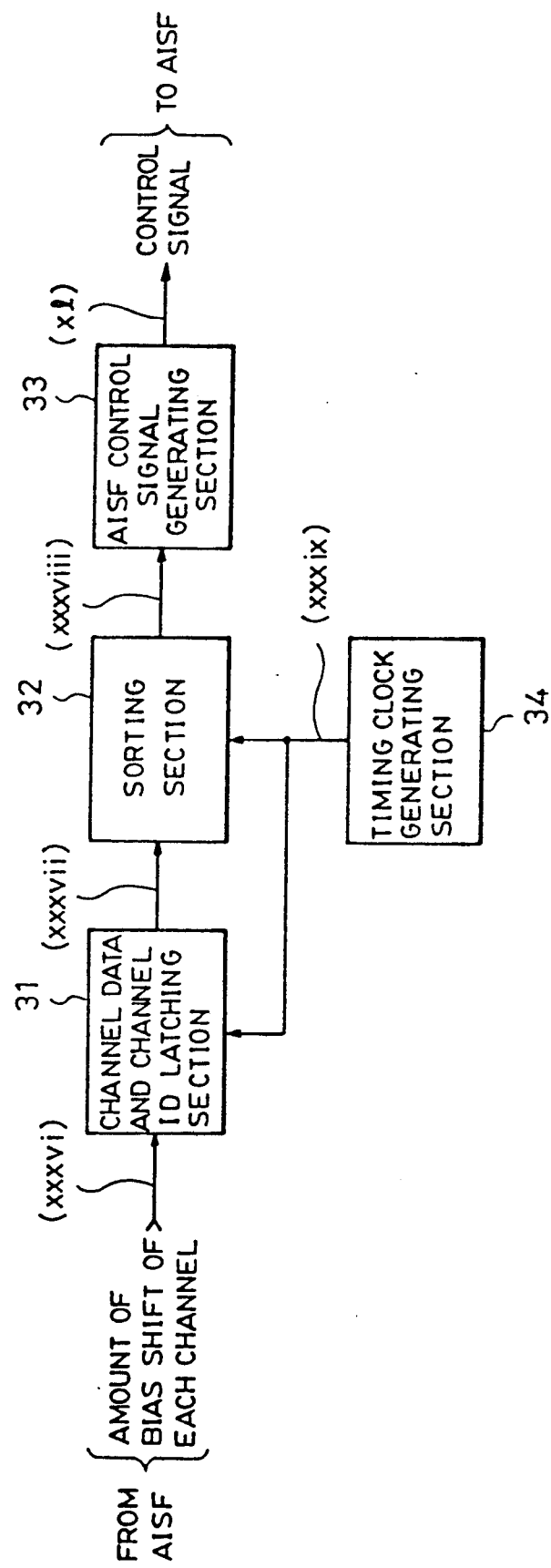
FIGS. 1, 2A and 3 are block diagrams showing an embodiment of the present invention.

Hereinbelow the present invention will be explained, referring to several embodiments indicated in the drawings.

FIG. 1 shows an embodiment of the bias control device according to the first invention, in which reference numeral 31 is a channel data and channel ID latching section; 32 is a sorting section; 33 is an AISF control signal generating section; and 34 is a timing clock generating section.

The channel data and channel ID latching section 31 latches channel data signals obtained by A/D converting bias shift signals corresponding to spectre intensities for different channels having different central frequencies outputted from the AISF. Further, at the same time, it latches channel ID signals indicating channel numbers of data for different channels.

The channel data signals for different channels are compared with a reference data signal. The sorting section 32 compares the magnitudes of the channel data (xxxvii) on the basis of deviations obtained by this comparison and rear anges the channel ID signals.

The AISF control signal generating section 33 outputs control signals (x() for the channels to be suppressed on the basis of the rearranged channel ID signals (xxxviii).

The timing clock generating section 34 outputs a clock for the A/D conversion and latch pulses (xxxix) for the A/D converted data.

Next the concrete construction of the embodiment indicated in FIG. 1 will be explained in detail, referring to FIGS. 2A, 3 and 4.

In order to simplify the explanation, it is supposed that the signal outputted by the AISF is the reference signal and 4 channels.

Figure 2A:
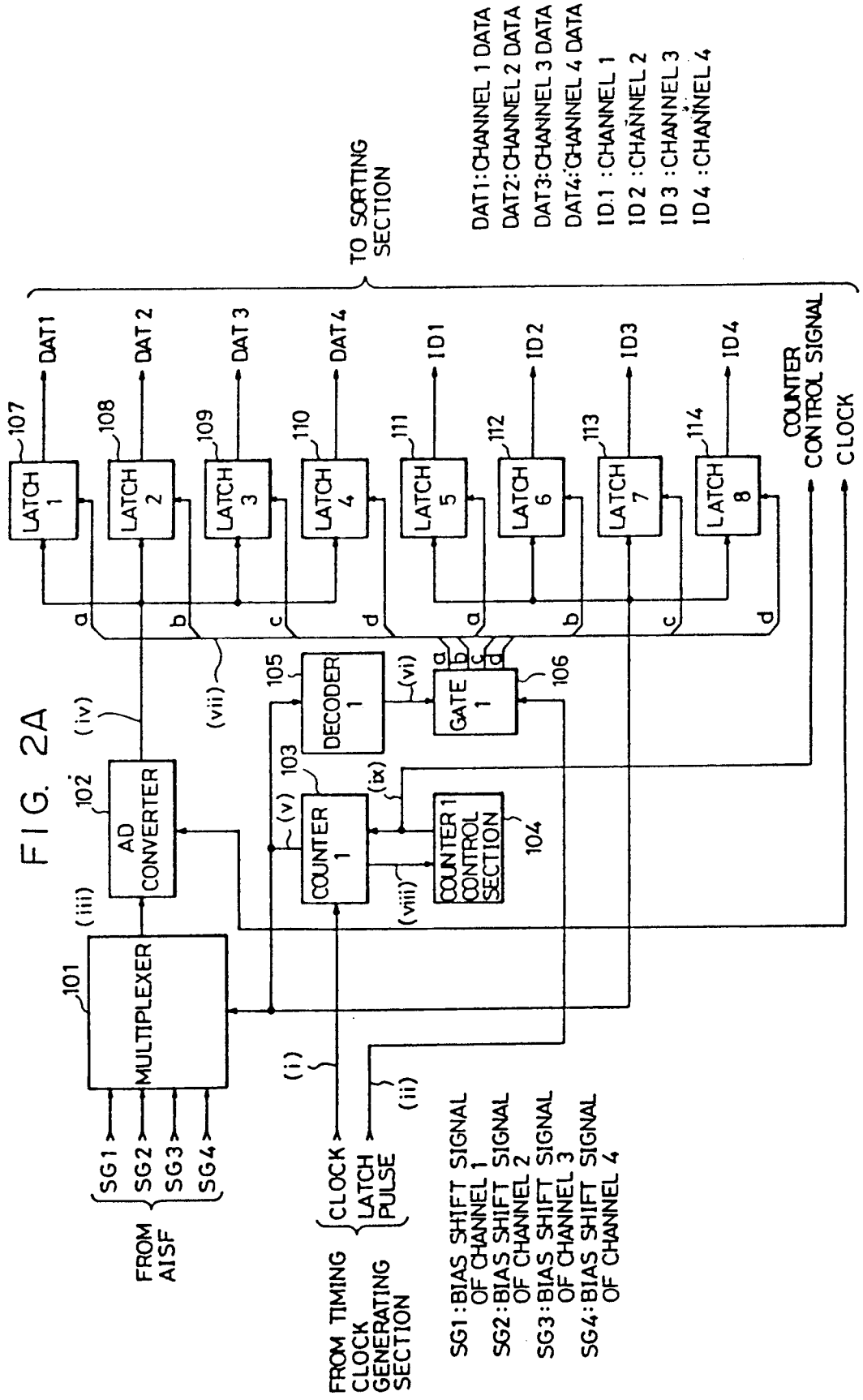

FIG. 2A shows the construction of the data channel and channel ID latching section indicated in FIG. 1; FIG. 3 shows the construction of the sorting section 32 indicated in FIG. 1; and FIG. 4 is a timing chart for explaining the present invention. In FIG. 2A, reference numeral 101 is a multiplexer; 102 is an A/D converter; 103 is a first counter; 104 is a first counter control section; 105 is a decoder; 106 is a first gate; and 107 to 114 is a first latch to an eighth latch.

In FIG. 2A, signals SG1 to SG4 of the four channels outputted by the AISF is inputted in the multiplexer 101 controlled by the output (v) of the counter 103. The multiplexer 101 inputs the 4 channel signals in the A/D converter 102 one after another. The A/D converter 102 is operated with the timing of the clock (i) driving the counter 103.

Figure 3:
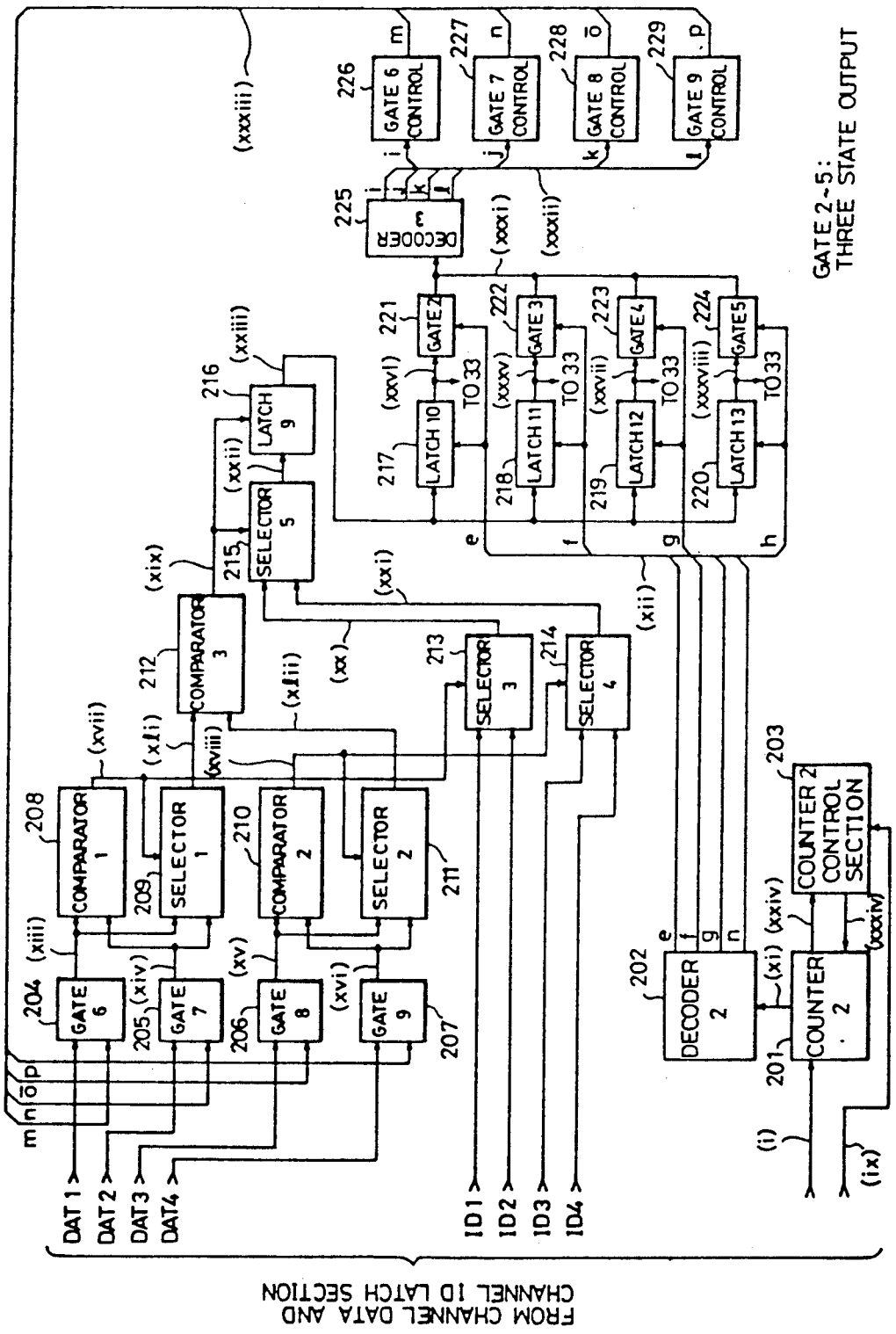

In FIG. 3, reference numeral 201 is a second counter; 202 is a second decoder; 203 is a second counter control section; 204 to 207 are a sixth gate to a ninth gate; 208 and 210 are a first and a second comparator; 209 and 211 are a first and a second selector; 212 is a third comparator; 213, 214 and 215 are a third, a fourth and a fifth selector; 216 to 220 are a ninth to a thirteenth latch; 221 to 224 are a second to a fifth gate having a three state output; 225 is a third decoder; 226 to 229 are a sixth to a ninth gate control section.

Figure 4:
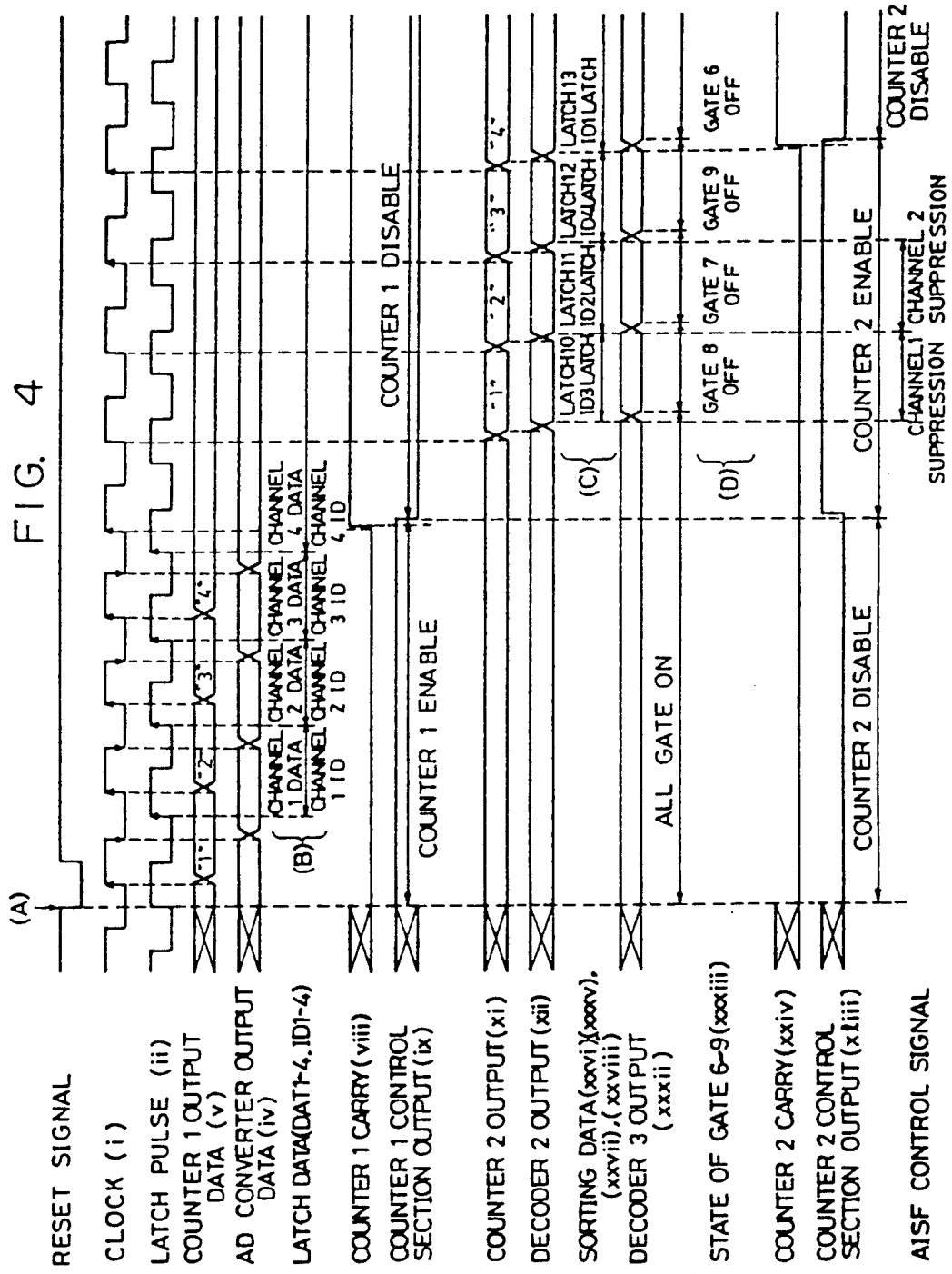
FIG. 4 is a timing chart for explaining the operation thereof.

The different parts indicated in FIGS. 2A and 3 are initialized in the state (A) indicated in FIG. 4. That is, the initial value of the first and the second counter 103 and 201 is "0"; the output of the first counter control section 104 is at a level, which enables the first counter 103; the output of the second counter control section 203 is at a level, which disables the second counter 201; and the output of the sixth to the ninth gate control section 226 to 229 is at a level, which turns-on the gates 204 to 207.

Further the bias shift signal SG1 of channel 1 selected by the output (v) of the first counter 103 is A/D converted and latched by the first latch 107 as channel 1 data (DAT 1') by means of a latch pulse (ii) selected by the first gate 106 by using an output (vi) obtained by the fact that the first decoder 105 decodes the output (v) of the first counter 103. Still further, at the same time, the output (v) of the first counter 103 is latched by the fifth latch 111 as the channel ID signal (ID1) for channel 1.

In the same way, the bias shift signals SG2 to SG4 for channels 2 to 4 are latched by the second to the fourth latch 108 to 110, respectively. Further, at the same time, the channel ID signals for channels 2 to 4 are latched by the sixth to the eighth latch 112 to 113 (FIG. 4(B)).

After the termination of the count for the four channels, the first counter 103 outputs the first counter carry (viii) to the first counter control section 104. The first counter control section 104 disables the first counter 103 with the timing of the first counter carry (viii) and at the same time outputs the output (ix) of the first counter control section 104 to the second counter control section 203.

Furthermore, the second counter control section 203 enables the second counter 201 with the timing of the output (ix) of the first counter control section 104.

The second decoder 202 outputs the second decode output (xii) obtained by decoding the second counter output (xi) to the tenth to the thirteenth latch 217 to 220 and the second to the fifth gate 221 to 224 and latches the channel ID signals (ID1 to ID4) in the tenth to the thirteenth latch 217 to 220 in the decreasing order of the channel data signals (DAT1 to DAT4) (FIG. 4(C)).

Now the operation will be explained, by which the channel ID signals (ID1 to ID4) are latched in the tenth to the thirteenth latch 217 to 220 in the decreasing order of the channel data signals in FIG. 3 (DAT1 to DAT4).

In order to simplify the explanation, it is supposed that the relation in the magnitude among the channel data (DAT1 to DAT4) latched by the first to the fourth latch 107 to 110 in FIG. 2A is expressed by;

DAT1<DAT4<DAT2<DAT3.

DAT1 and DAT2 are inputted in the first comparator 208 and the first selector 209 through the sixth gate 204 and the seventh gate 205, respectively. Since DAT1<DAT2, the first comparator 208 outputs a signal of selecting the channel data signal DAT2 (xiv) to the first selector 209 and at the same time a signal of selecting the channel ID signal ID2 to the third selector 213. Also for the channel data signal DAT3 and DAT4 as well as the channel ID signals ID3 and ID4, it is operated in the same way with a relation;

DAT4<DAT3.

The channel data signals DAT2 (xli) and DAT3 (xlii) selected by the first selector 209 and the second selector 211 are inputted in the third comparator 212. On the other hand, the channel ID signal ID2 (xx) and ID3 (xxi) selected by the third selector 213 and the fourth selector 214 are inputted in the fifth selector 215. Now, since DAT2<DAT3, the third compartor 212 outputs a signal of selecting the channel ID signal ID3 (xxi) to the fifth selector 215 and at the same time a signal of latching the channel ID signal ID3 (xxii) selected by the fifth selector 215 to the ninth latch 216. The ninth latch 216 outputs the channel ID signal ID3 (xxiii) finally selected to the tenth to the thirteenth latch 217 to 220 and the tenth latch 217 selected by the second decoder 202 latches ID3 as the channel ID signal having the first spectre intensity. At the same time the second gate 221 having the three state output is made enable by the second decoder 202 and the channel ID signal ID3 is outputted to an output line (xxxi) wired-connected of the second to the fifth gate 221 to 224.

The third decoder 225 decodes the channel ID signal ID3 and outputs a signal of turning-off the eighth gate 206 to the eighth gate control section 228. Consequently the eighth gate 206 changes the channel data signal DAT3 output (xv) to "0" (FIG. 4(D)).

The operation described above is repeated so that the channel ID signals ID1 to ID4 are rearranged and latched by the tenth to the thirteenth latch 217 to 220. After the termination of the count of the 4 channels the second counter 201 outputs the second counter carry (xxiv) to the second counter control section 203. The second counter control section 203 disables the second counter 201 with the timing of the second counter carry (xxiv).

The channel ID signals ID3 (xxvi), ID2 (xxxv), ID4 (xxvii) and ID1 (xxviii), which are arranged so that the spectre intensities latched by the tenth to the thirteenth latch 217 to 220 are arranged in the decreasing order, are inputted in the gates 221 to 234 and at the same time inputted in the AISF control signal generating section 33 as the input signals. The AISF control signal generating section 33 applies the backward bias to the predetermined channels of pn diodes by carrying out the operation e.g. as indicated in the flow chart in FIG. 5.

Figure 5:
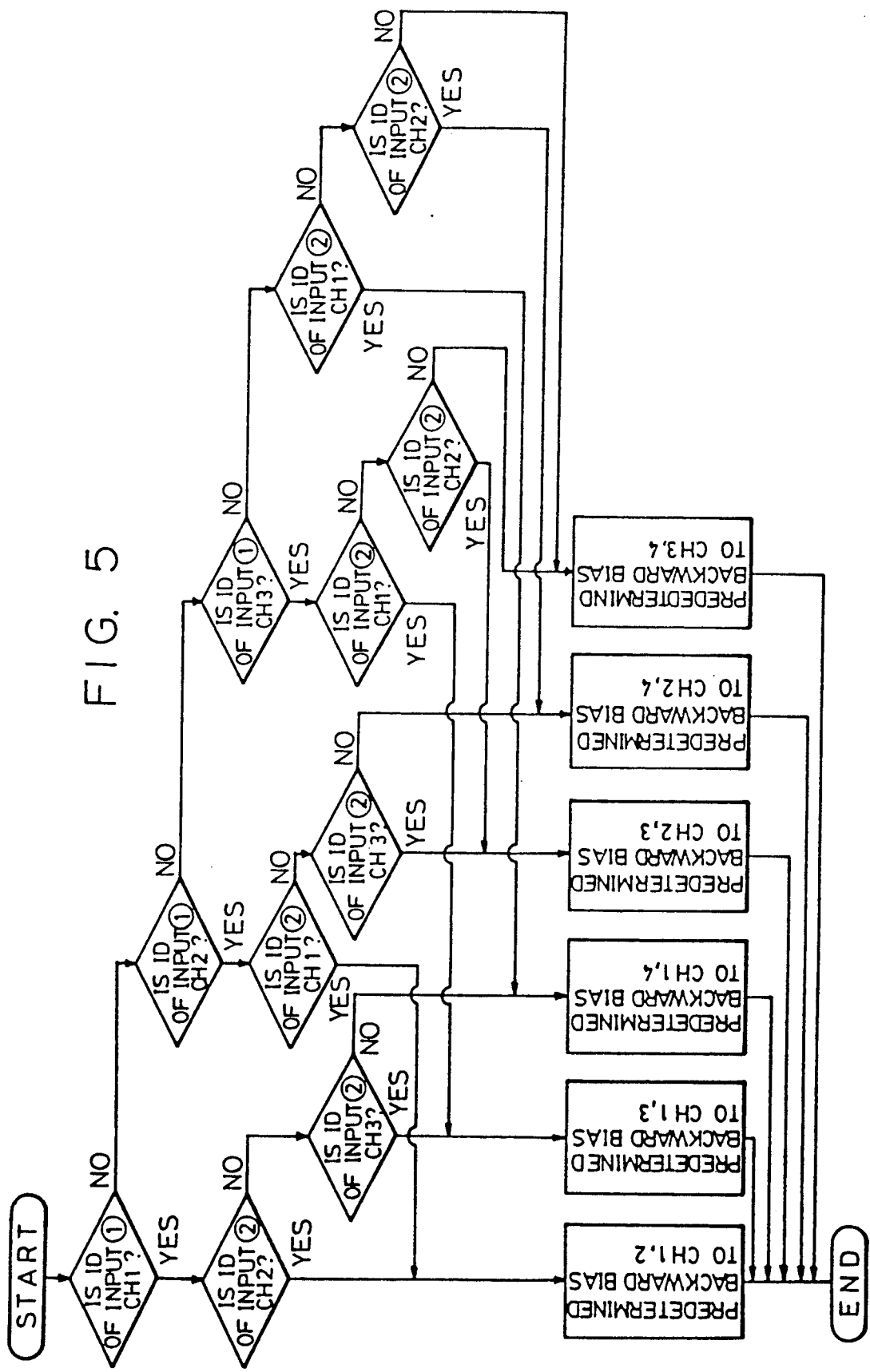
FIG. 5 is a flow chart indicating the operation of an AISF control signal generating section.
Figure 6A:
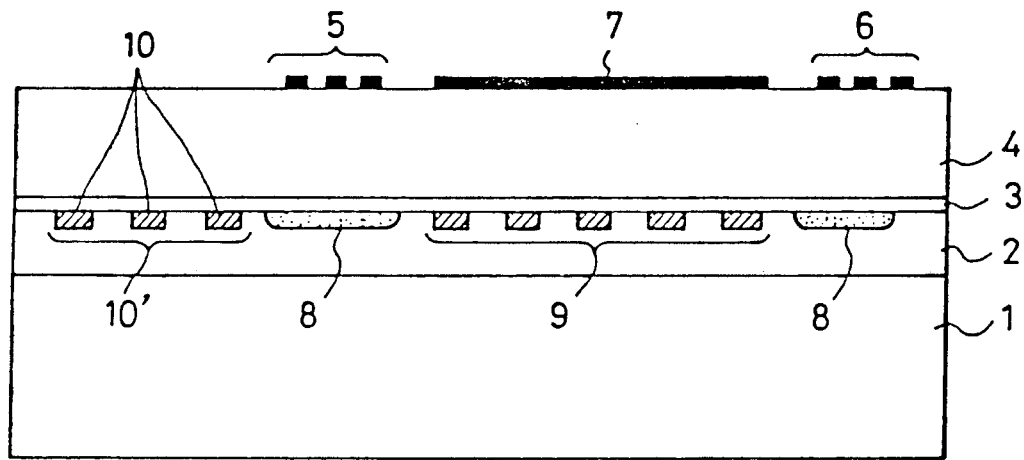
Figure 6B:
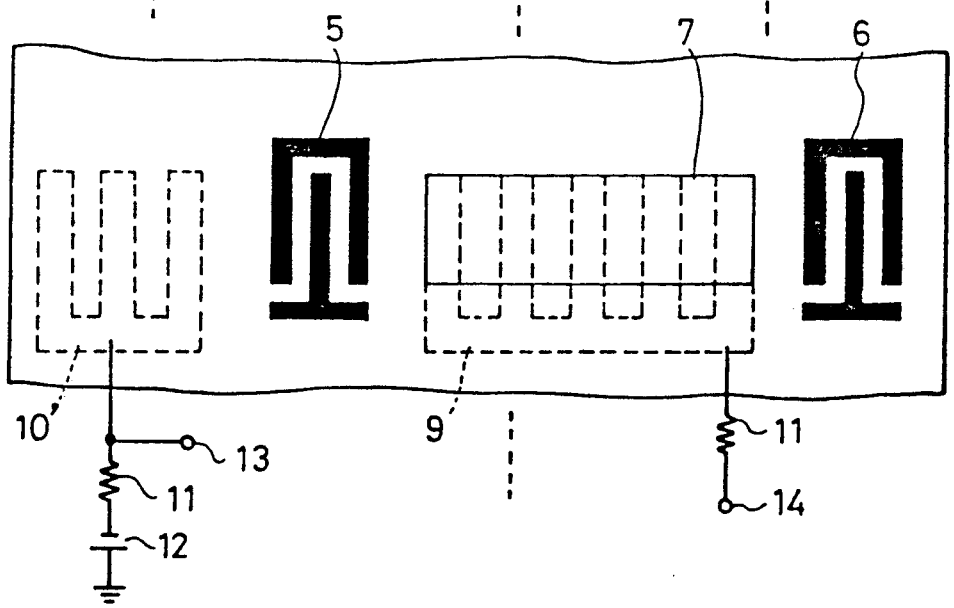
Figure 8:
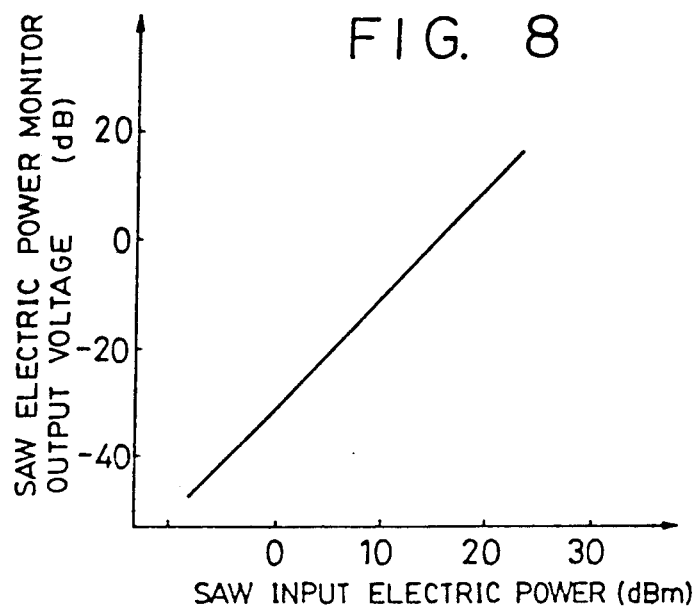
FIG. 8 shows the relation between the electric power of the SAW input and the SAW electric power monitor output voltage in the element stated above.
Figure 9:
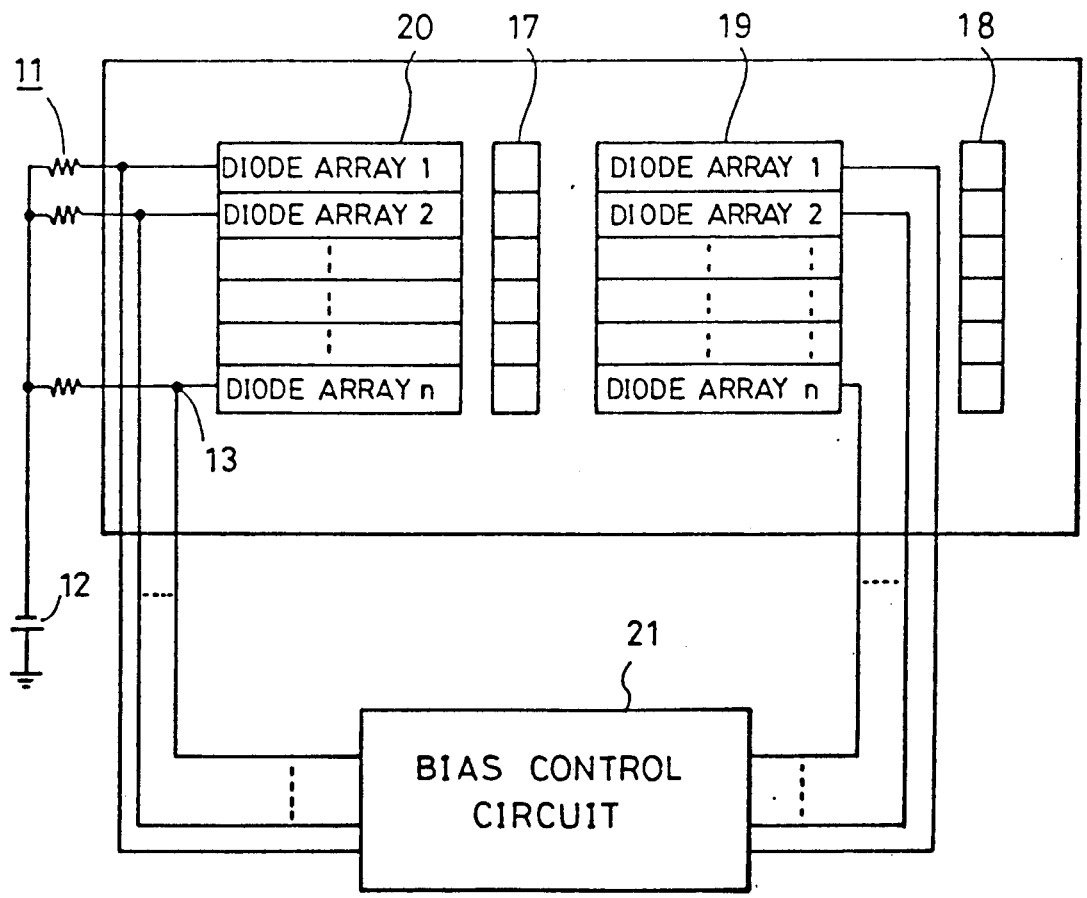
FIG. 9 is a block diagram indicating an AISF device using the SAW element stated above.
Figure 10A:
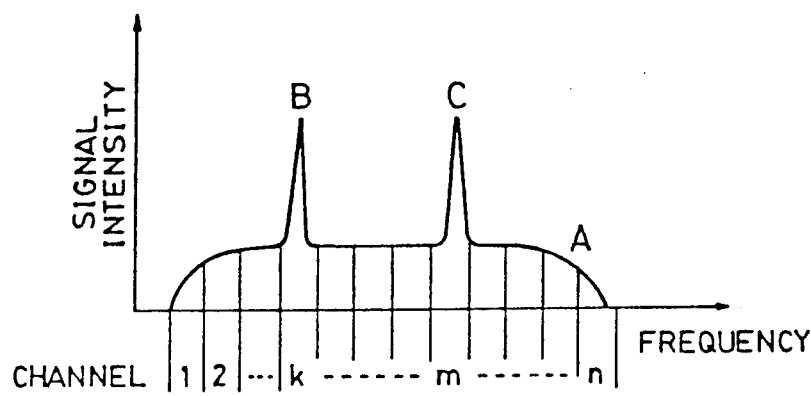
FIGS. 10(a), 10(b) and 10(c) are schemes for explaining the flow of the signal processing of that device.
Figure 10B:
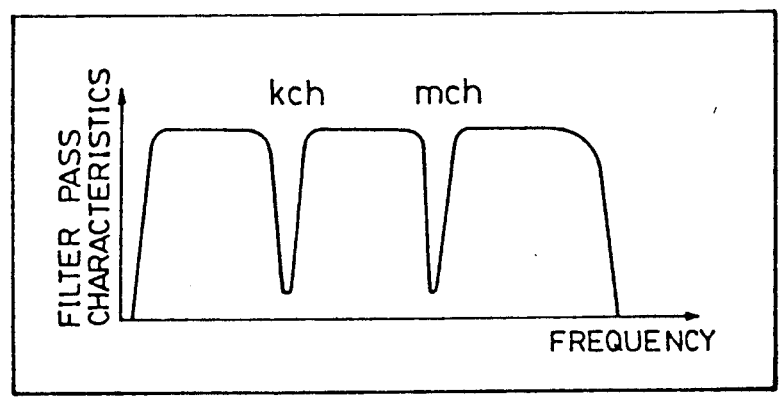
Figure 10C:
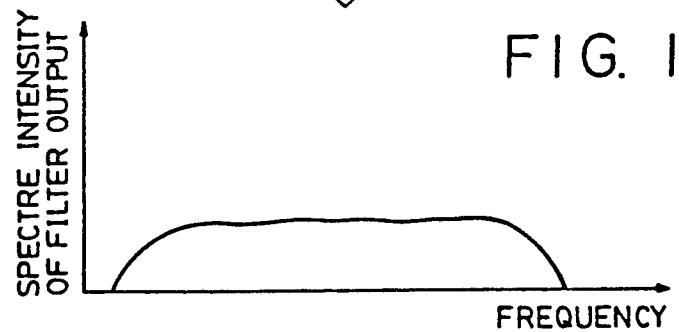
Figure 11:
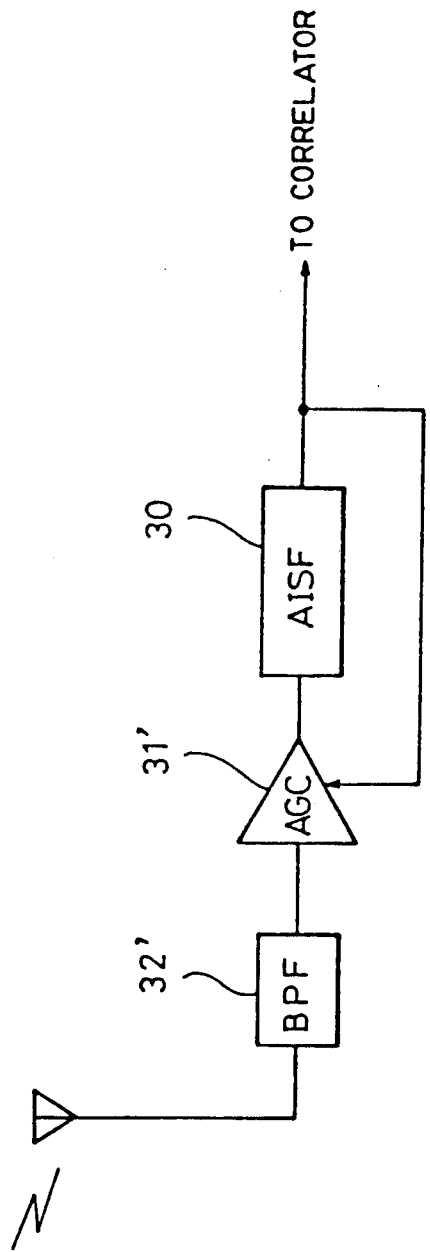
FIG. 11 is a block diagram indicating a part of the receiving section in a DS-SS system using the system indicated in FIG. 9.
Figure 12A:
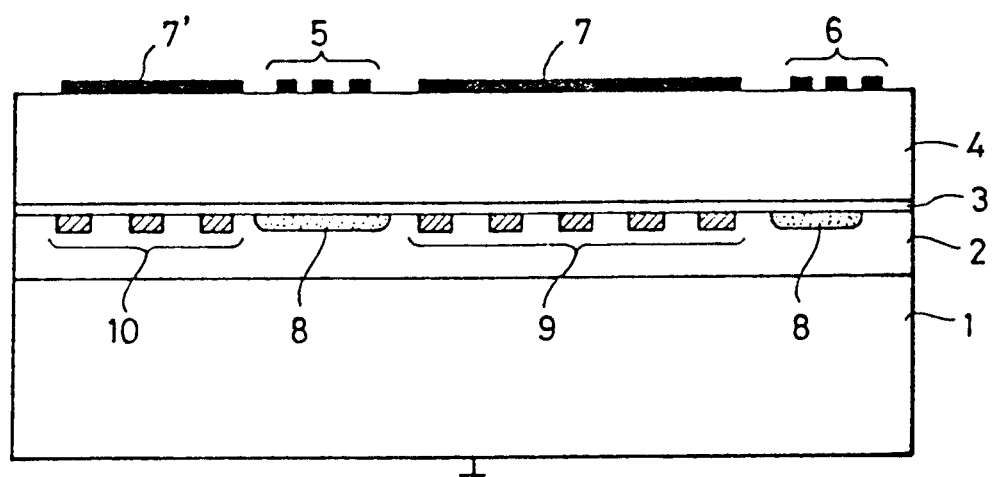
FIGS. 12A, 12B and 13A, 13B are schemes showing modified examples of the SAW elements indicated in FIGS. 6A, 6B and 7A, 7B.
Figure 12B:
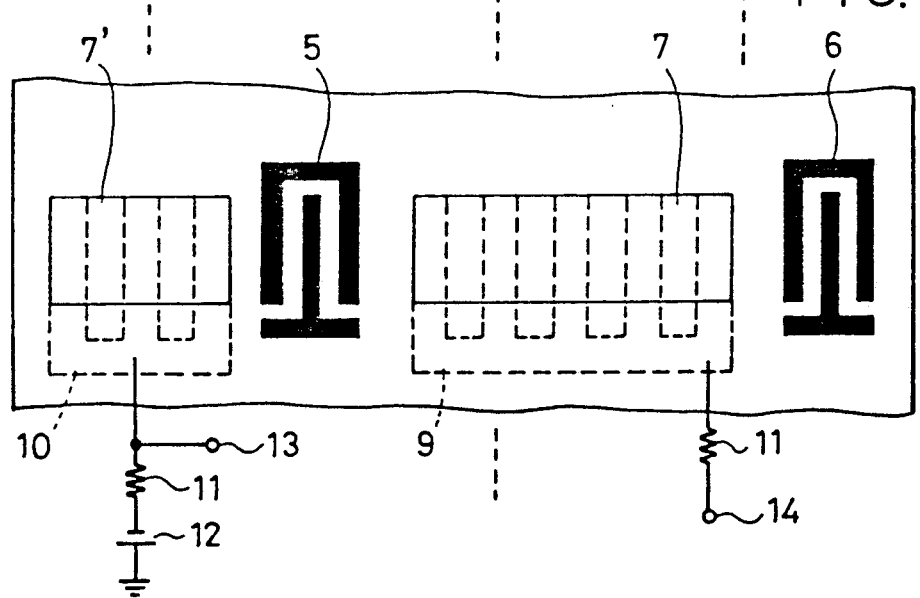
Figure 13A:
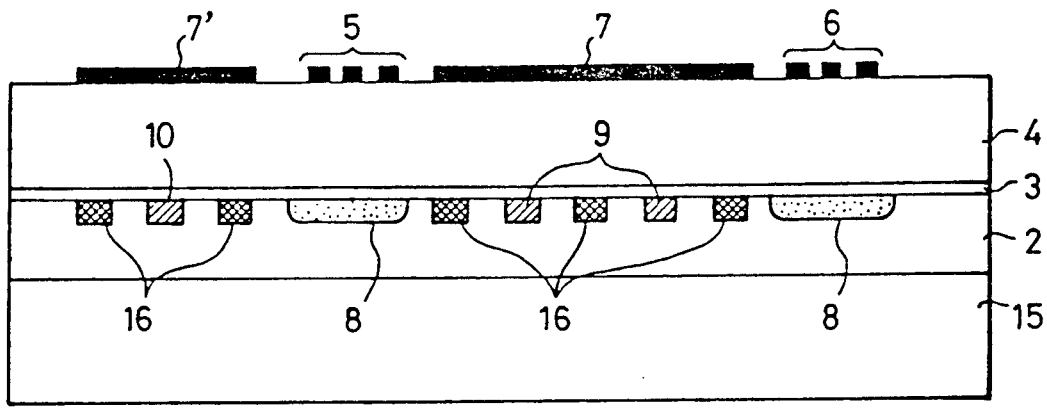
Figure 13B:
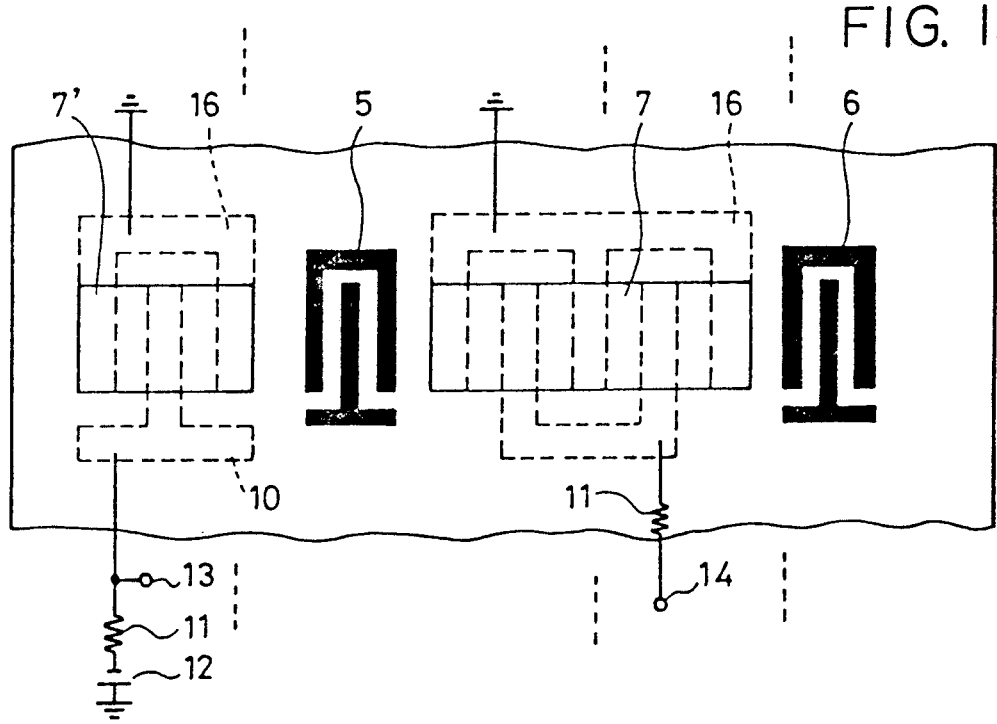
Figure 16:
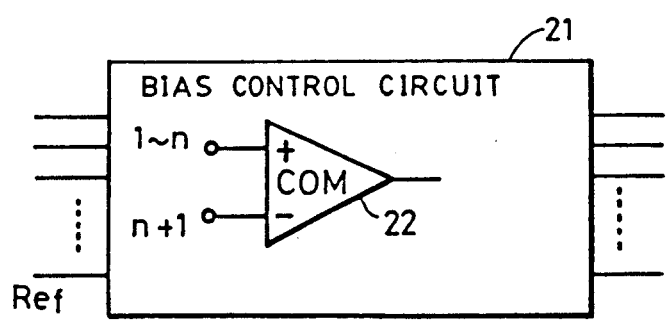
FIGS. 14 and 16 are block diagrams showing another AISF device according to the invention disclosed in the older application.

The flow chart in FIG. 5 shows a case where the first and the second channel are suppressed in the spectre intensity among the 4 channels.

Figure 2B:
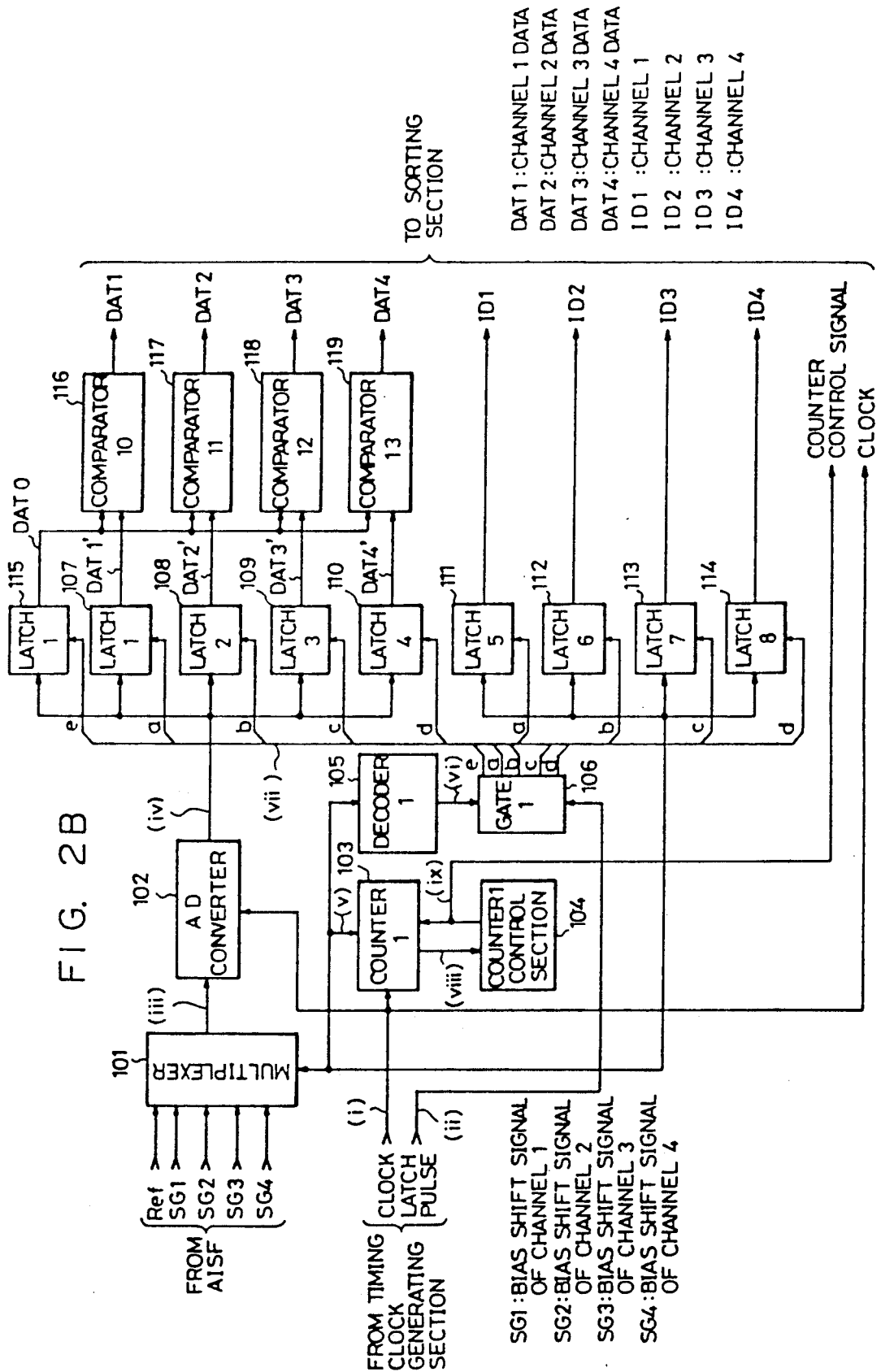
FIG. 2B is a block diagram showing another embodiment of the present invention.
Figure 14:
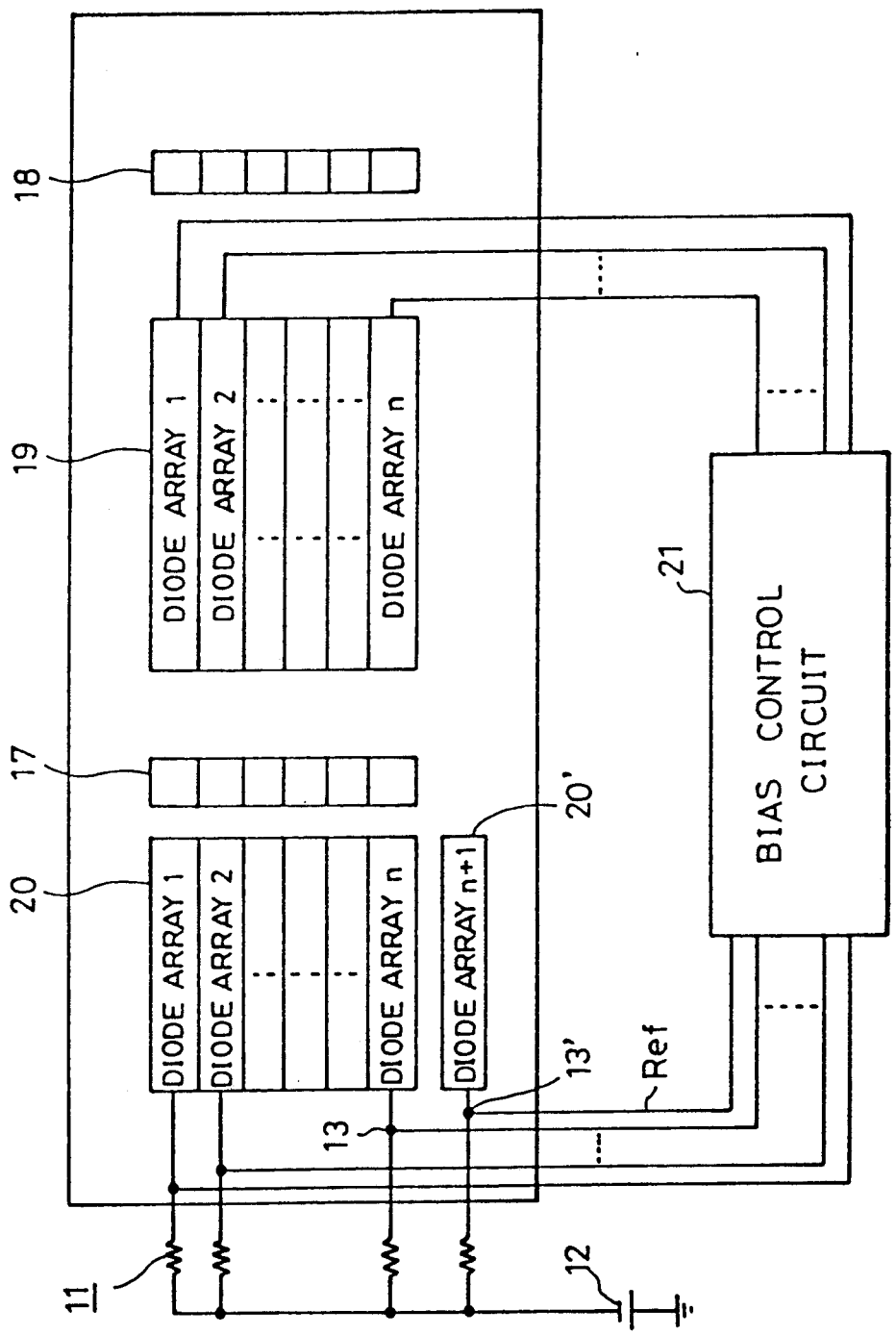
Figure 15A:
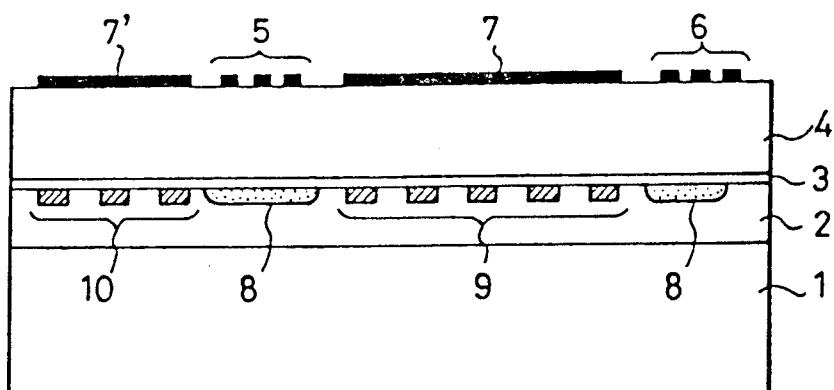
FIGS. 15A, 15B and 15C show an example of the SAW element used in he device indicated in FIG. 14.
Figure 15B:
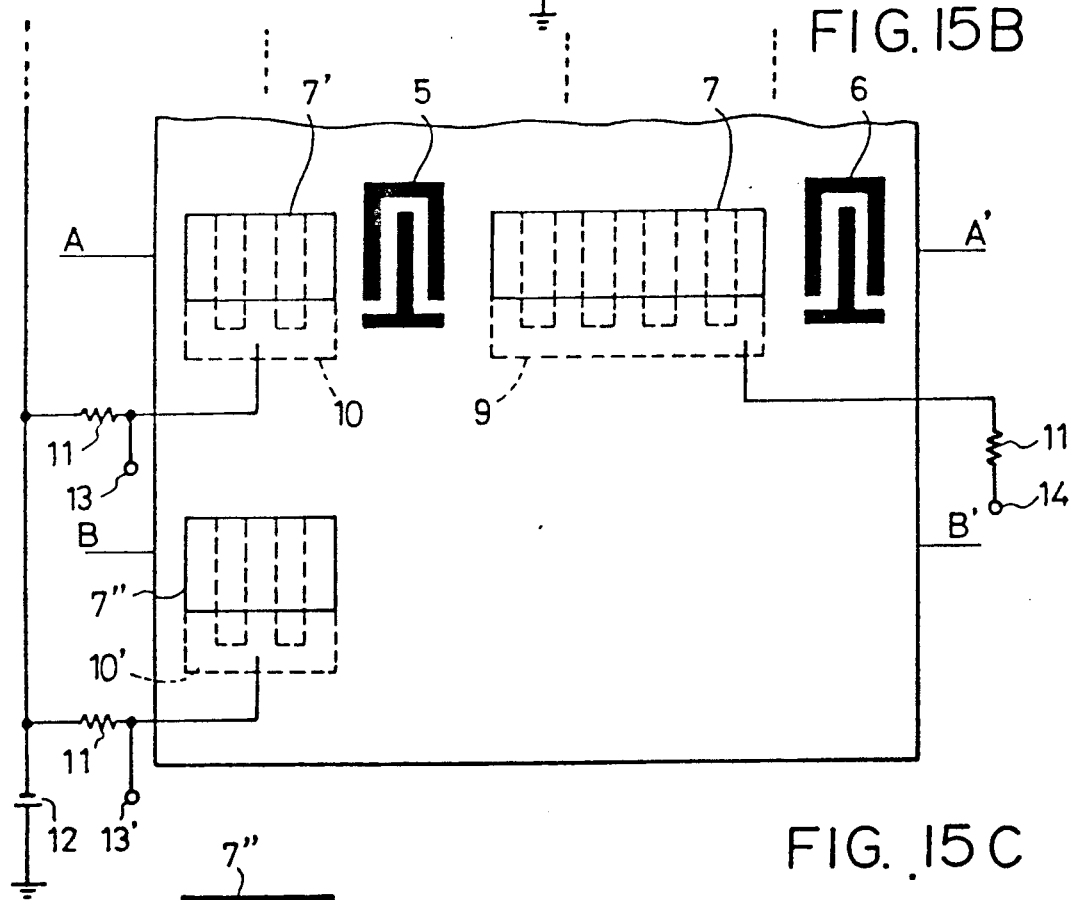
Figure 15C:
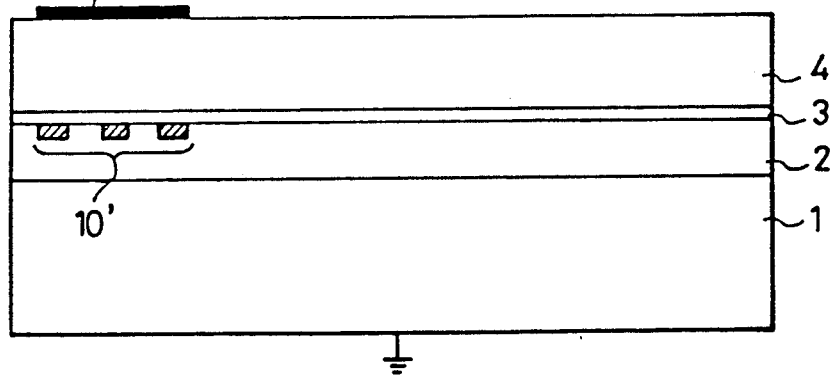

FIG. 2B shows, as an embodiment of a second invention an example of the construction of only the sorting section 32 in FIG. 1, suitable for the case where the AISF device indicated in FIG. 14 is used, in which the other construction and the operation in FIG. 1 are identical to those described previously and the same reference numerals as those indicated in FIG. 2A represent identical or analogous circuits, a latch 115 and comparators 116 to 119 being disposed as indicated in the figure in addition thereto.

In FIG. 2B, a reference signal Ref and the 4 signals SG1 to SG4 of the 4 channels outputted by the AISF are inputted in the multiplexer 101 controlled by the output (v) of the counter 103. The multiplexer 101 inputs the reference signal and the 4 channel signals in the A/D converter one after another. The A/D converter 102 is operated with the timing of the clock (i) driving the counter 103.

The reference signal Ref selected by the output (v) of the first counter 103 is A/D-converted and latched in the 0-th latch 115 as reference data (DAT0) by the latch pulse (ii) selected by the first gate 106 by using the output (vi) obtained by the fact that the first decoder 105 decodes the output (v) of the first counter 103. Further the bias shift signal SG1 for channel 1 selected by the output (v) of the first counter 103 is A/D-converted and latched in the first latch 107 as channel 1 data (DAT1') by the latch pulse (ii) selected by the first gate 106 by using the output (vi) obtained by the fact that the first decoder 105 decodes the output (v) of the first counter 103. Further, at the same time, the output (v) of the first counter 103 is latched in the fifth latch 111 as the channel ID signal (ID1) for channel 1.

In the same way, the bias shift signals SG2 to SG4 for channels 2 to 4 are latched by the second to the fourth latch 108 to 110, respectively. Further, at the same time, the channel ID signals for channels 2 to 4 are latched by the sixth to the seventh latch 112 to 114 (FIG. 4(B)).

The latched channel data (DAT1' to DAT4') are compared with the reference data (DAT0) by the tenth to the thirteenth comparator 116 to 119 and deviations of the channel data (DAT1' to DAT4') from the reference data (DAT0) are outputted as new channel data (DAT1 to DAT4).

As explained above, it is possible to realize a bias control device suitable for an AISF, which deals with the level difference between the bias shift signal for each channel and the reference signal corresponding to internal noise in a digital manner. In addition, although it can be thought that inconveniences are produced in scale, cost, fabrication in the form of an IC, efficient utilization of functions, etc. both in hardware and in software, when this bias control circuit for the AISF is realized by using a microprocessor system, etc. according to the present invention, it is possible to realize the fundamental function, in the case where the microprocessor system, etc. are used, by using only hardware. Therefore the inconveniences described above are not produced and remarkable effect is obtained in practice.

What is claimed is:

1. A bias control device comprising:
   a narrow band interference suppressing filter which includes: an input transducer and an output transducer for forming a plurality of channels in a surface acoustic wave propagation path disposed on a piezoelectric substrate, which channels have propagating therealong respective surface acoustic waves introduced into said piezoelectric substrate by said input transducer at respective frequencies different from each other; a first group of diode arrays formed between said input transducer and said output transducer; and a second group of diode arrays formed in said surface acoustic wave propagation path on a side of said input transducer opposite from said first group of diode arrays;
   a latch section, in which output signals coming from said second group of diode arrays are inputted and which holds channel data signals, each of which represents a bias shift corresponding to a spectral intensity of a respective surface acoustic wave propagating along a respective one of the channels, and at the same time generates channel ID signals representing channel numbers corresponding to said channel data signals and holds said channel ID signals;
   a sorting section, which compares magnitudes of the channel data signals held in said latch section with each other and rearranges the channel ID signals outputted by said latch section on the basis of the result of the comparison; and
   a control signal generating section, which outputs channel control signals to said first group of diode arrays on the basis of the channel ID signals rearranged by said sorting section.

2. A bias control device according to claim 1 wherein said sorting section comprises:
   gate means for gating the respective channel data signals corresponding to the spectral intensities of different channels coming from said latch section by means of respective control signals;
   a comparator, in which the channel data signals obtained through said gate means are inputted and which compares the magnitudes of the inputs with each other;
   a selector for selecting the channel ID signal representing the channel number corresponding to the result of the comparison;
   a plurality of latches for respectively holding successive channel ID signals selected by said selector;
   latch control means for successively making respective said latches hold respective said channel ID signals successively selected by said selector and at the same time output selectively the ID signals held by said plurality of latches; and
   a gate control section for generating said control signals for said gate means in response to the channel ID signals read out from said plurality of latches.

3. A bias control device according to claim 1 wherein said latch section comprises:
   a multiplexer having inputs to which are applied signals coming from said second group of diode arrays;
   an A/D converter for A/C converting the output of said multiplexer; and
   latch means having a plurality of latches holding respective said channel data signals outputted by said A/D converter.

4. A bias control device according to claim 1 wherein said latch section comprises: a counter to which clocks are inputted, and a plurality of latches to which an output of said counter is inputted and in which the output is latched at a predetermined timing, each said latch holding a counter output value representing a respective said channel ID signal.

5. A bias control device comprising:
   a narrow band interference suppressing filter which includes: an input transducer and an output transducer for forming a plurality of channels in a surface acoustic wave propagation path disposed on a piezoelectric substrate, which channels have propagating therealong respective surface acoustic waves introduced into said piezoelectric substrate by said input transducers at respective frequencies different from each other; a first group of diode arrays formed between said input transducer and said output transducer; a second group of diode arrays formed in said surface acoustic wave propagation path on a side of said input transducer opposite from said first group of diode arrays; and a reference diode array juxtaposed to said second group of diode arrays;

a latch section, in which output signals coming from said second group of diode arrays and said reference diode array are inputted and which holds channel data signals, each of which represents a bias shift corresponding to a spectral intensity of a respective surface acoustic wave propagating along a respective one of the channels, and holds a reference signal corresponding to internal noise of said filter;

calculating means for obtaining differences of the channel data signals held in said latch section from said reference signal;

a channel ID signal latch section, which generates channel ID signals representing channel numbers corresponding to said channel data data signals and holds said channel ID signals;

a sorting section, which compares magnitudes of said differences from said calculating means and rearranges the channel ID signals outputted by said latch section on the basis of the result of the comparison; and a control signal generating section, which output channel control signals to said first group of diode arrays on the basis of the channel ID signals rearranged by said sorting section.

6. A bias control device according to claim 2 wherein said sorting section comprises:

gate means for gating respective difference signals corresponding to the respective differences from said calculating means by means of respective control signals;

a comparator, in which the difference signals obtained through said gate means are inputted and which compares the magnitudes of the inputs with each other;

a selector for selecting the channel ID signal representing the channel number corresponding to the result of the comparison;

a plurality of latches for respectively holding successive channel ID signals selected by said selector;

latch control means for successively making respective said latches hold respective said channel ID signals successively selected by said selector and at the same time output selectively the ID signals held by said plurality of latches; and a gate control section for generating said control signals for said gate means in response to the channel ID signals read out from said plurality of latches.

7. A bias control device according to claim 5 wherein said latch section comprises:

a multiplexer having inputs to which are applied signals coming from said second group of diode arrays and said reference diode array;

an A/D converter for A/D converting the output of said multiplexer; and latch means having a plurality of latches holding respective said channel data signals outputted by said A/D converter and a latch for holding the reference signal output by said A/D converter.

8. A bias control device according to claim 7 wherein said calculating means includes a plurality of comparators each having one input to which is applied a signal from the latch latching the reference signal, and a further input to which is applied a signal from a respective one of said plurality of latches latching said channel data signals.

9. A bias control device according to claim 5 wherein said latch section comprises: a counter to which clocks are inputted, and a plurality of latches to which an output of said counter is inputted and in which the output is latched at a predetermined timing, each said latch holding a counter output value representing a respective said channel ID signal.

* * * * *

UNITED STATES PATENT AND TRADEMARK OFFICE
CERTIFICATE OF CORRECTION

PATENT NO. : 5,127,020

DATED : June 30, 1992

INVENTOR(S) : Takao KURIHARA

It is certified that error appears in the above-identified patent and that said Letters Patent is hereby corrected as shown below:

Column 10, line 51; replace "A/C" with ---A/D---.

Column 11, line 27; delete "data" (second occurrence).

line 39; replace "Claim 2" with ---Claim 5---.

Signed and Sealed this

Twenty-eighth Day of September, 1993

Attest:

BRUCE LEHMAN

Attesting Officer

Commissioner of Patents and Trademarks